US010829868B2

(12) United States Patent
Akiyama et al.

(10) Patent No.: US 10,829,868 B2
(45) Date of Patent: Nov. 10, 2020

(54) MANUFACTURING METHOD OF SIC COMPOSITE SUBSTRATE

(71) Applicants: Shin-Etsu Chemical Co., Ltd., Tokyo (JP); CUSIC Inc., Sendai (JP)

(72) Inventors: Shoji Akiyama, Annaka (JP); Yoshihiro Kubota, Annaka (JP); Hiroyuki Nagasawa, Sendai (JP)

(73) Assignees: SHIN-ETSU CHEMICAL CO., LTD., Tokyo (JP); CUSIC INC., Sendai (JP)

( * ) Notice: Subject to any disclaimer, the term of this patent is extended or adjusted under 35 U.S.C. 154(b) by 298 days.

(21) Appl. No.: 15/759,285

(22) PCT Filed: Sep. 9, 2016

(86) PCT No.: PCT/JP2016/076538
§ 371 (c)(1),
(2) Date: Mar. 12, 2018

(87) PCT Pub. No.: WO2017/047509
PCT Pub. Date: Mar. 23, 2017

(65) Prior Publication Data
US 2018/0251910 A1    Sep. 6, 2018

(30) Foreign Application Priority Data

Sep. 15, 2015  (JP) .................................. 2015-181937

(51) Int. Cl.
C30B 33/06         (2006.01)
C23C 16/01         (2006.01)
(Continued)

(52) U.S. Cl.
CPC .............. *C30B 33/06* (2013.01); *C23C 16/01* (2013.01); *C23C 16/325* (2013.01); *C23C 16/42* (2013.01);
(Continued)

(58) Field of Classification Search
CPC ...... C30B 33/06; C30B 25/186; C23C 16/325; C23C 16/01; H01L 21/20
See application file for complete search history.

(56) References Cited

U.S. PATENT DOCUMENTS 4,582,561 A * 4/1986 Ioku ......................... C30B 11/00
                                                     117/56
5,363,798 A * 11/1994 Yoder ...................... C30B 25/02
                                                     117/89
(Continued)

FOREIGN PATENT DOCUMENTS

JP    7-335562    A    12/1995
JP    5051962    B2    10/2012
JP    2015-15401  A    1/2015
WO    2009/066566 A1    5/2009
(Continued)

OTHER PUBLICATIONS

Specification of commercially available Si wafers on Aug. 23, 2015 (Year: 2015).*
(Continued)

*Primary Examiner* — Leith S Shafi
*Assistant Examiner* — Inja Song
(74) *Attorney, Agent, or Firm* — Westerman, Hattori, Daniels & Adrian, LLP

(57) ABSTRACT

A manufacturing method of an SiC composite substrate 10 that includes a single crystal SiC layer 12 on a polycrystalline SiC substrate 11. After manufacturing a single crystal SiC layer supporting body 14 by providing the single crystal SiC layer 12 on one surface of a holding substrate 21 including Si. A polycrystalline SiC is deposited on the single crystal SiC layer 12 through chemical vapor deposition to manufacture an SiC laminated body 15 laminated with the single crystal SiC layer 12 and the polycrystalline SiC layer 11 having a thickness t on the holding substrate 21'. At the same time, the single crystal SiC layer supporting body 14 is heated at a temperature less than 1,414 degrees Celsius,
(Continued)

and a portion of the thickness t of the polycrystalline SiC is deposited. Then, the holding substrate 21' is physically and/or chemically removed.

8 Claims, 2 Drawing Sheets

(51) Int. Cl.
    *C30B 25/18*      (2006.01)
    *C30B 29/36*      (2006.01)
    *C23C 16/42*      (2006.01)
    *C23C 16/32*      (2006.01)

(52) U.S. Cl.
    CPC ............ *C30B 25/18* (2013.01); *C30B 25/186* (2013.01); *C30B 29/36* (2013.01)

(56) References Cited

U.S. PATENT DOCUMENTS

| | | | |
|---|---|---|---|
| 6,867,067 B2 * | 3/2005 | Ghyselen | H01L 21/3148 438/107 |
| 6,964,914 B2 | 11/2005 | Ghyselen et al. | |
| 2010/0252837 A1 | 10/2010 | Izumi et al. | |
| 2016/0204023 A1 | 7/2016 | Imaoka et al. | |

FOREIGN PATENT DOCUMENTS

| | | |
|---|---|---|
| WO | 2009/107188 A1 | 9/2009 |
| WO | 2014/020694 A1 | 2/2014 |

OTHER PUBLICATIONS

International Search Report dated Nov. 8, 2016, issued in counterpart International Application No. PCT/JP2016/076538 (2 pages).

* cited by examiner

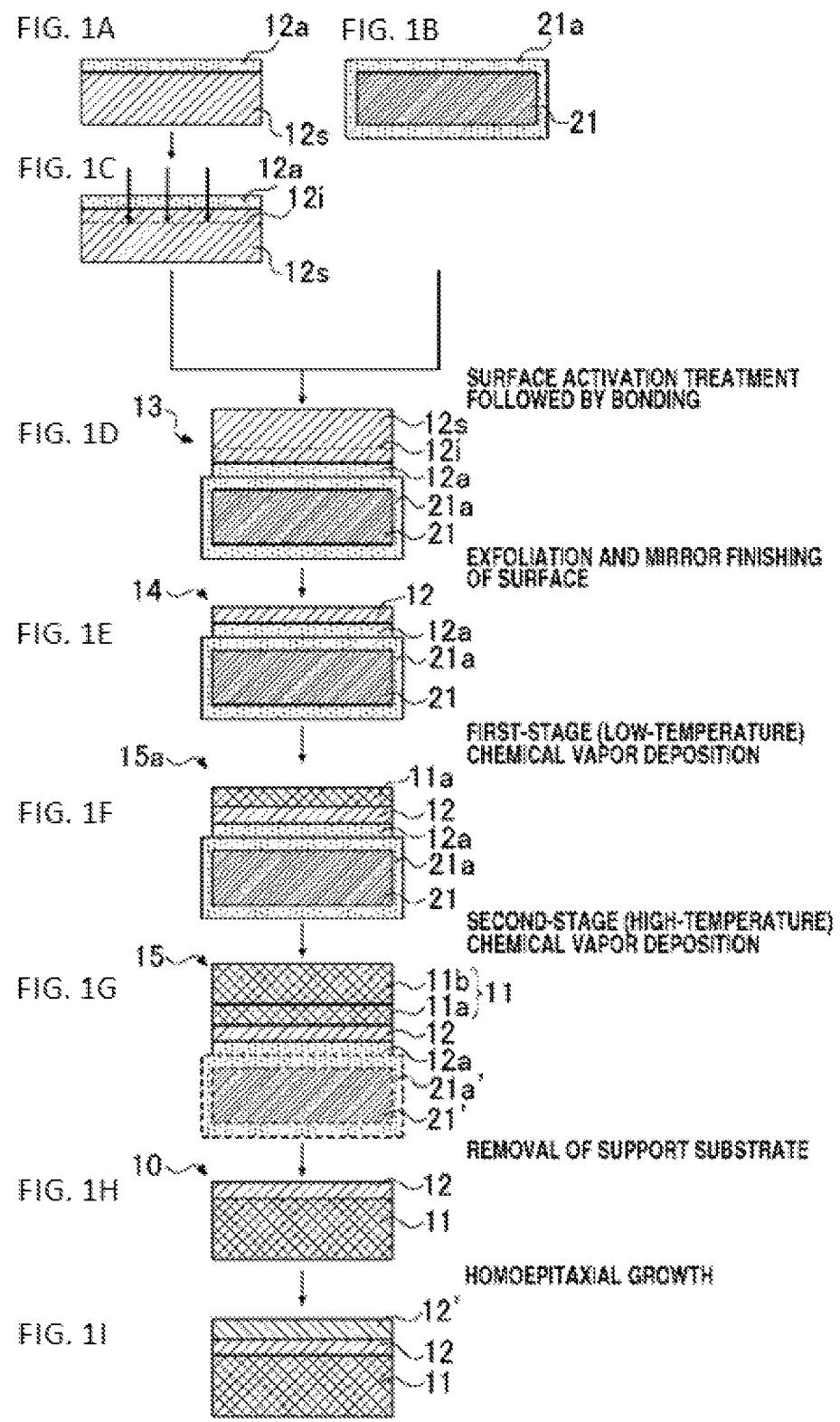

MANUFACTURING METHOD OF SIC COMPOSITE SUBSTRATE

TECHNICAL FIELD

The present invention relates to a method for producing a silicon carbide (SiC) composite substrate having a monocrystalline SiC layer on a polycrystalline SiC substrate, which composite substrate can be used in the fabrication of power semiconductor devices, such as Schottky barrier diodes, pn diodes, pin diodes, field effect transistors and insulated gate bipolar transistors (IGBT), utilized for power control at high temperatures, frequencies and power levels, and in the growth of gallium nitride, diamond and nanocarbon thin films.

BACKGROUND ART

Monocrystalline silicon substrates are widely used today as substrates for semiconductors. However, their characteristics do not always make them suitable for recent trends toward higher withstand voltages and higher frequencies. Hence, although expensive, use is starting to be made of monocrystalline SiC and monocrystalline GaN substrates. For example, by employing semiconductor devices made with silicon carbide (SiC), which is a semiconductor material having a greater forbidden bandwidth than silicon (Si), to build power converters such as inverters and AC/DC converters, a reduction in power loss unattainable with semiconductor devices that use silicon has been achieved. Compared with earlier art, the use of SiC-based semiconductor devices reduces loss associated with power conversion and promotes a lighter weight, smaller size and high reliability in the power converter. Monocrystalline SiC substrates are also under investigation as starting materials for nanocarbon thin-films (including graphene) as a next-generation device material.

Typical methods for producing such monocrystalline SiC substrates and monocrystalline GaN substrates are as follows. (1) Monocrystalline SiC substrates are produced using an SiC sublimation process that grows seed crystals while sublimating SiC by subjecting a high-purity SiC powder to an elevated temperature of at least 2,000° C. (2) Monocrystalline GaN substrates are produced by a process that grows GaN seed crystals within high-temperature, high-pressure ammonia or by additionally inducing the heteroepitaxial growth of GaN on a sapphire or monocrystalline SiC substrate. However, because these production processes are carried out under extremely exacting conditions and are complicated, the substrate quality and yield are inevitably low, resulting in very high-cost substrates, which is an impediment to their commercialization and widespread use.

The substrate thickness at which device functions actually manifest on these substrates is in each case between 0.5 and 100 µm. The remaining thickness portion carries out primarily a mechanical holding/protective function during substrate handling; that is, it serves primarily as a handle member (substrate).

Substrates wherein a monocrystalline SiC layer, for which the degree of thickness that allows handling is relatively thin, is bonded to a polycrystalline SiC substrate with an intervening ceramic such as $SiO_2$, $Al_2O_3$, $Zr_2O_3$, $Si_3N_4$ or AlN or an intervening metal such as silicon, titanium, nickel, copper, gold, silver, cobalt, zirconium, molybdenum or tin have been studied recently. However, when the intervening material for bonding the monocrystalline SiC layer and the polycrystalline SiC substrate is the former (a ceramic), the fact that this material is an insulator makes electrode production at the time of device fabrication difficult; when the intervening material is the latter (a metal), metallic impurities contaminate the device and tend to give rise to a deterioration in the device characteristics, which is impractical.

Various art for ameliorating these drawbacks has hitherto been described. For example, JP No. 5051962 (Patent Document 1) discloses a method which involves bonding together, at the silicon oxide faces, a source substrate which is a silicon oxide thin film-bearing monocrystalline SiC substrate that has been ion-implanted with hydrogen or the like with an intermediate support (handle substrate) of polycrystalline aluminum nitride having silicon oxide formed on the front side thereof, thereby transferring the monocrystalline SiC thin-film to the polycrystalline aluminum nitride (intermediate support), subsequently depositing thereon polycrystalline SiC and then placing the workpiece in a HF bath so as to dissolve and separate the silicon oxide faces. However, in general, because the silicon oxide faces are very closely and strongly bonded together, the HF does not readily penetrate over the entire surface of the silicon oxide faces, particularly the center portions thereof, as a result of which separation is not easy and takes an excessive amount of time, making for very poor productivity. Another problem is that, when fabricating a large-diameter SiC composite substrate using this invention, a large amount of warpage arises due to the difference between the coefficients of thermal expansion for the deposited layer of polycrystalline SiC and for the aluminum nitride (intermediate support).

JP-A 2015-15401 (Patent Document 2) discloses, for substrates whose surfaces are difficult to planarize, a method wherein a polycrystalline SiC-supporting substrate surface is amorphously modified, without oxide film formation, by means of a fast atomic beam and a monocrystalline SiC surface is also amorphously modified, following which both surfaces are brought into contact and thermal bonding is carried out, thereby stacking a monocrystalline SiC layer on a polycrystalline SiC-supporting substrate. However, in this method, the fast atomic beam alters not only the exfoliated interface of the monocrystalline SiC but also the crystal interior. As a result, this monocrystalline SiC, even with subsequent heat treatment, is not easily restored to good-quality monocrystalline SiC; hence, when used in a device substrate, template or the like, obtaining a device having high characteristics or a good-quality SiC epitaxial film is difficult.

In addition to these drawbacks, in order to bond together the monocrystalline SiC with the polycrystalline SiC of the supporting substrate in the foregoing art, the bonding interface must have a smoothness corresponding to a surface roughness (arithmetic mean surface roughness Ra) of 1 nm or less. Yet, SiC is said to be the next most difficult-to-machine material after diamond. Even when a monocrystalline SiC surface is amorphously modified, subsequent smoothing processes such as grinding, polishing or chemical mechanical polishing (CMP) take an extremely long time, making higher costs unavoidable. Moreover, because polycrystalline materials have grain boundaries, carrying out fast atomic beam amorphization so as to achieve in-plane uniformity is difficult, leading to problems with the bonding strength and warpage, which has created major obstacles to commercialization.

PRIOR ART DOCUMENTS

Patent Documents

Patent Document 1: JP 5051962
Patent Document 2: JP-A 2015-15401

SUMMARY OF INVENTION

Technical Problem

As described above, major problems hindering the commercialization of SiC composite substrates exist in the prior art, including their high cost arising from the poor crystallinity of monocrystalline SiC and the complicated production process, and their inapplicability to precision semiconductor fabrication processes on account of large warpage of the SiC composite substrate.

The present invention was arrived at in light of the above circumstances. The object of this invention is to provide a method for producing SiC composite substrates that is simple and convenient and is capable of obtaining SiC composite substrates having a monocrystalline SiC layer of good crystallinity and little warpage.

Solution to Problem

In order to achieve this object, the invention provides the following method for producing SiC composite substrates.
[1] A method for producing a SiC composite substrate comprising a monocrystalline SiC layer on a polycrystalline SiC substrate, the method comprising the steps of, in order: providing a monocrystalline SiC layer on one side of a support substrate made of silicon so as to produce a monocrystalline SiC layer carrier; during the production of a SiC laminate comprising the monocrystalline SiC layer and a polycrystalline SiC substrate of thickness t stacked on the support substrate by using a chemical vapor deposition process to deposit polycrystalline SiC on the monocrystalline SiC layer, heating the monocrystalline SiC layer carrier to below 1,414° C. and depositing thereon only part of the thickness t of the polycrystalline SiC, subsequently raising the temperature to 1,414° C. or above and additionally depositing polycrystalline SiC up to the thickness t while melting at least part of the support substrate, and then cooling; and physically and/or chemically removing the support substrate.
[2] The SiC composite substrate production method of [1], wherein the thickness of the polycrystalline SiC deposited when the monocrystalline SiC carrier is heated to below 1,414° C. is at least 30 μm.
[3] The SiC composite substrate production method of [1] or [2], wherein the thickness t of the polycrystalline SiC substrate is at least 100 μm and not more than 650 μm.
[4] The SiC composite substrate production method of any of [1] to [3], wherein the chemical vapor deposition process is thermal chemical vapor deposition.
[5] The SiC composite substrate production method of any of [1] to [4], wherein an intermediate layer made of silicon oxide, silicon nitride or silicon oxynitride is provided between the support substrate and the monocrystalline SiC layer.
[6] The SiC composite substrate production method of any of [1] to [5], wherein the monocrystalline SiC layer is provided by transferring onto the support substrate a monocrystalline SiC thin film exfoliated from a monocrystalline SiC substrate by ion-implantation exfoliation.
[7] The SiC composite substrate production method of any of [1] to [5], wherein the monocrystalline SiC layer is provided by heteroepitaxial growth of SiC on the support substrate.

Advantageous Effects of Invention

In this invention, by carrying out, during the production of a SiC laminate made up of a monocrystalline SiC layer and a polycrystalline SiC substrate of thickness t stacked on a support substrate by using a chemical vapor deposition process to deposit polycrystalline SiC on the monocrystalline SiC layer, heating of a monocrystalline SiC layer carrier to below 1,414° C. and deposition thereon of only part of the thickness t of the polycrystalline SiC, subsequent raising of the temperature to 1,414° C. or above and the additional deposition of polycrystalline SiC up to the thickness t while melting at least part of the support substrate, and then cooling, and by thereafter physically and/or chemically removing the support substrate, warpage due to stresses (thermal stress and internal stress) caused by the difference between the coefficients of thermal expansion for the monocrystalline SiC and for the support substrate can be suppressed, making it possible to produce a SiC composite substrate of excellent shape.

BRIEF DESCRIPTION OF DRAWINGS

FIGS. 1A through 1I are diagrams showing production steps in an embodiment of the SiC composite substrate production method of the invention.

DESCRIPTION OF EMBODIMENTS

Figure 2A:
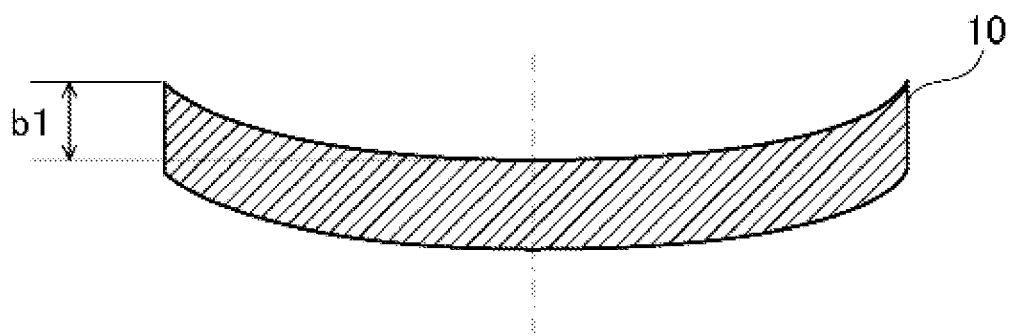
FIGS. 2A and 2B show schematic diagrams depicting a method for measuring the amount of bow in a SiC composite substrate.

The inventors have carried out the following investigations in order to resolve the above problems. That is, because it is generally possible to epitaxially grow a SiC layer, it is not a problem for the high-quality monocrystalline SiC layer serving as the seed to be thin. One would therefore think that costs could be greatly lowered by exfoliating a thin film from a bulk wafer of monocrystalline SiC and transferring it to an underlying support wafer. However, because device processes using conventional SiC substrates reach temperatures of 1,800° C., the support wafer must be made of a material which can withstand such elevated temperatures and for which, moreover, metal contamination is not a concern. In light of this, it appears to be most appropriate for the support wafer to be a substrate made of polycrystalline SiC. In this case, given that both the thin film and the support wafer are made of SiC, problems such as warpage and cracking caused by a difference in thermal expansion coefficients are also avoidable. Here, a bonding process is conceivable as the method for stacking the monocrystalline SiC thin film and the polycrystalline SiC substrate, although bonding requires atomic-order (angstrom-order) smoothing of the polycrystalline SiC substrate surface. However, in polycrystalline SiC substrates, the crystal grain boundaries (grain boundaries) and crystal orientations are randomly arranged, making atomic-level smoothing extremely difficult. The inventors have thus devised the following method for producing SiC composite substrates.

This production method is a method for producing a SiC composite substrate having a monocrystalline SiC layer on a polycrystalline SiC substrate, and is characterized by providing a monocrystalline SiC layer on one side of a support substrate made of silicon so as to produce a monocrystalline SiC layer carrier, subsequently depositing polycrystalline SiC on the monocrystalline SiC layer by chemical vapor deposition so as to produce a SiC laminate made up of a monocrystalline SiC layer and a polycrystalline SiC substrate stacked on a support substrate, and then physically and/or chemically removing the support substrate.

Here, because a substrate made of silicone (Si) has mechanical strength and physical and/or chemical removal (i.e., grinding or chemical etching) thereof is easy to carry out, it is suitable for use as the support substrate in the inventive production method. The support substrate may be either a polycrystalline silicon wafer or a monocrystalline silicon wafer. When a monocrystalline silicon wafer is used as the support substrate, the availability of high-quality large-diameter substrates at low cost enables production costs for SiC composite substrates to be reduced as well. Alternatively, it is also possible to heteroepitaxially grow monocrystalline cubic SiC on a monocrystalline Si wafer. This obviates the need for monocrystalline SiC substrate bonding and exfoliation steps, making it possible to produce a large-diameter SiC composite substrate at a lower cost than commercially available bulk SiC wafers.

With this method for producing SiC composite substrates, the support substrate is not a difficult-to-work AlN substrate, but an easy-to-work Si substrate, and so machining and chemical treatment can be carried out with great ease. Therefore, the support substrate can easily be removed by simple and convenient grinding or polishing, or by inexpensive chemical etching treatment with KOH, HF or the like, eliminating the need to reclaim/recycle the troublesome and high-cost AlN as in Patent Document 1 and making it possible to produce high-quality SiC composite substrates at low cost.

However, because a support substrate made of silicon has a coefficient of thermal expansion that differs from that of a monocrystalline SiC layer or a polycrystalline SiC substrate (specifically, SiC has a higher thermal expansion coefficient than Si), and moreover because internal stress tends to build up in a polycrystalline SiC substrate formed by chemical vapor deposition, warpage readily arises in a support substrate-containing laminate (specifically, when returning the laminate to room temperature, the center portion of the substrate in the SiC laminate has a tendency to become downwardly convex). When such warpage arises in the course of production and is left uncorrected, the shape of the SiC composite substrate ends up reflecting the warpage, and so a planar substrate is not obtained. When the SiC composite substrate lacks planarity, not only is it difficult to handle the SiC composite substrate in subsequent steps, fabricating precise, fine-featured devices becomes more difficult. For example, the use of photolithographic processes in device production becomes difficult, hampering commercialization of the SiC composite substrate.

The inventors have conducted various investigations on this problem of warpage, whereupon it has become clear that, during the production of a SiC laminate obtained by depositing polycrystalline SiC on a monocrystalline SiC layer carrier in the course of producing an SiC composite substrate, the difference between the coefficients of thermal expansion for the monocrystalline SiC and the silicon when the temperature of the monocrystalline SiC layer carrier is raised causes warping to occur. In addition, the inventors have realized that thermal stress caused by the difference between the thermal expansion coefficients for the monocrystalline SiC layer carrier and the polycrystalline SiC and internal stress caused by the chemical vapor-deposited film arise during polycrystalline SiC deposition, and that these stresses induce warpage of the SiC composite substrate. Upon further investigation, they have discovered that, in the step of forming a polycrystalline SiC substrate by chemical vapor deposition, when the SiC laminate is heated to at least the melting point of silicon (1,414° C.) prior to cooling of the SiC laminate to room temperature at the end of the process, the stresses (thermal stress and internal stress) caused by the polycrystalline SiC substrate are suitably released, enabling a SiC composite substrate that is substantially free of warpage to be obtained. The inventors have conducted even further intensive investigations based on this finding and have improved the above-devised SiC composite substrate production method by adding specific steps thereto, ultimately arriving at the present invention.

That is, the inventive method for producing SiC composite substrates is a method for producing a SiC composite substrate having a monocrystalline SiC layer on a polycrystalline SiC substrate, which method is characterized by including the steps of, in order: providing a monocrystalline SiC layer on one side of a support substrate made of silicon so as to produce a monocrystalline SiC layer carrier; during the production of a SiC laminate comprising the monocrystalline SiC layer and a polycrystalline SiC substrate of thickness t stacked on the support substrate by using a chemical vapor deposition process to deposit polycrystalline SiC on the monocrystalline SiC layer, heating the monocrystalline SiC layer carrier to below 1,414° C. and depositing thereon only part of the thickness t of the polycrystalline SiC, subsequently raising the temperature to 1,414° C. or above and additionally depositing polycrystalline SiC up to the thickness t while melting at least part of the support substrate, and then cooling; and physically and/or chemically removing the support substrate.

It should be noted here that, because the monocrystalline SiC layer carrier is a composite material made primarily of SiC and silicon (SiC on Si), warpage caused by the difference between the thermal expansion coefficients for SiC and silicon becomes more acute at increasingly high temperature. Therefore, when SiC deposition is carried out at or below the melting point of silicon, warpage arises in the SiC composite substrate in accordance with this deposition temperature, and such warpage remains unchanged following deposition. However, by suitably controlling the SiC deposition thickness in the low-temperature region, the amount of such warpage can be reduced.

When the deposition thickness in the low-temperature region is too thick, the SiC composite substrate assumes a shape that corresponds to the warpage in this temperature region. However, when the thickness in the low-temperature region is appropriate, the silicon constituent of the monocrystalline SiC layer carrier melts when the workpiece moves to a high-temperature region (>1,414° C.) and stress in the silicon is released, making it possible for the warpage to be released. At this time, if the thickness of the SiC deposited in the low-temperature region is too small, it cannot support its own weight when the silicon melts in the high-temperature range, as a result of which the shape worsens. It is thus presumably desirable for the thickness of the SiC deposited in the low-temperature region to be of a degree where the SiC is just barely able to support its own weight. The specific thickness range will be subsequently described.

Accordingly, by heating the SiC laminate to 1,414° C. or above, the support substrate made of silicon enters into a nearly liquid state, enabling the polycrystalline SiC to be deposited to a larger film thickness without being affected by stress and strain of the support substrate.

It is preferable for the polycrystalline SiC to be deposited to a thickness of at least 30 μm when the monocrystalline SiC layer carrier is heated to below 1,414° C. (first-stage (low-temperature) vapor deposition), and for additional polycrystalline SiC to be deposited by subsequently heating the SiC laminate to 1,414° C. or above (second-stage (high-temperature) vapor deposition). By depositing polycrystalline SiC to a thickness of at least 30 μm in first-stage (low-temperature) vapor deposition, this polycrystalline SiC substrate having a thickness of 30 μm or more can keep the shape of the SiC laminate even when part or all of the support substrate melts in second-stage (high-temperature) vapor growth.

The polycrystalline SiC substrate has a thickness t of preferably at least 100 μm and not more than 650 μm, more preferably at least 200 μm and not more than 600 μm, and even more preferably at least 300 μm and not more than 500 μm.

Letting the thickness of the polycrystalline SiC substrate be t, the monocrystalline SiC layer carrier is first heated to below 1,414° C. and polycrystalline SiC is deposited to a thickness of preferably at least 0.075 t and not more than 0.5 t, and more preferably at least 0.187 t and not more than 0.5 t (first-stage (low-temperature) vapor deposition), following which the SiC laminate is heated to 1,414° C. or more and polycrystalline SiC is additionally deposited up to the thickness t, such as by polycrystalline SiC deposition in a thickness of preferably at least 0.5 t and not more than 0.925 t, and more preferably at least 0.5 t and not more than 0.813 t (second-stage (high-temperature) vapor deposition). It is preferable to suitably adjust the deposition thickness in this first-stage (low-temperature) vapor deposition or the deposition thickness in the second-stage (high-temperature) vapor deposition according to the internal stress in the polycrystalline SiC substrate and the degree of warpage in the SiC laminate.

In this case, the amount of bow in the SiC composite substrate may be adjusted to preferably between −50 μm and +75 μm, and more preferably between −50 μm and +50 μm. At an amount of bow in the SiC composite substrate 10 between −50 μm and +75 μm, it is possible to clamp the SiC composite substrate 10 with a vacuum chuck or an electrostatic chuck in the manufacturing equipment during the semiconductor device fabrication process. At an amount of bow in the SiC composite substrate 10 between −50 μm and +50 μm, the SiC composite substrate 10 can be clamped without difficulty by a vacuum chuck or an electrostatic chuck in the manufacturing equipment during the semiconductor device fabrication process.

It is preferable to use thermal CVD as the chemical vapor deposition (CVD) process for forming the polycrystalline SiC substrate. Because polycrystalline SiC is deposited and formed on the monocrystalline SiC layer, unlike in the prior art, there is no need for a highly planarizing operation that relies on grinding, polishing, CMP or the like of the hard-to-machine material SiC.

The thickness of the support substrate is preferably at least 200 μm and not more than 600 μm, and more preferably at least 300 μm and not more than 500 μm. Having the thickness of the support substrate be at least 200 μm enables the shape of the monocrystalline SiC layer carrier to be maintained; having the thickness be not more than 600 μm enables the support substrate to be easily removed physically and/or chemically.

It is preferable to provide an intermediate layer (also referred to as an intervening layer) made of silicon oxide, silicon nitride or silicon oxynitride between the support substrate and the monocrystalline SiC layer. This intermediate layer not only strongly bonds the monocrystalline SiC layer to the support substrate, it can also be made to function as an etch stopping layer when, after most of the support substrate made of silicon has been removed by grinding or the like, removing what remains of the support substrate by chemical etching. Also, by carrying out chemical etching treatment in such a way that the etchant such as HF comes into direct contact with the entire surface of the intermediate layer during removal of the support substrate, the intermediate layer can easily and uniformly be completely removed. As a result, the surface of the monocrystalline SiC layer is obtained in a very smooth and clean state.

Also, in this SiC composite substrate production method, it is preferable to transfer onto the support substrate and thereby provide a monocrystalline SiC thin film that has been exfoliated from a monocrystalline SiC substrate by an ion implantation process. Alternatively, the monocrystalline SiC thin film may be provided on the support substrate by the heteroepitaxial growth of SiC. In this way, by a single ion implantation exfoliation treatment or by heteroepitaxial growth, there can be obtained a monocrystalline SiC layer which has the minimum required film thickness and determines the characteristics of the SiC composite substrate, thus enabling a SiC composite substrate of excellent characteristics to be economically produced.

As noted above, during the production of a SiC laminate having a monocrystalline SiC layer and a polycrystalline SiC substrate stacked on a support substrate by using a chemical vapor deposition process to deposit polycrystalline SiC on the monocrystalline SiC layer, when heating the monocrystalline SiC layer carrier to about 1,100 to 1,300° C. and depositing polycrystalline SiC by chemical vapor deposition, because the temperature at this time is a very high temperature for the support substrate made of silicon, if cooled in this state, the support substrate ends up deforming due to strain under its own weight, slip dislocations and the like. Moreover, due to the appearance of thermal stress caused by the difference between the thermal expansion coefficient for the monocrystalline SiC layer carrier having a monocrystalline SiC layer supported on a support substrate made of silicon and for the polycrystalline SiC and internal stress originating in the chemical vapor deposited film, warpage ultimately arises in the SiC composite substrate. However, if one attempts to carry out vapor deposition at a lower temperature than this so as to keep such strain and slip dislocations from arising in the support substrate, this leads to a major decline in the deposition rate and thus a decreased throughput. Hence, in this invention, by heating the monocrystalline SiC layer carrier to below 1,414° C. and using a chemical vapor deposition process to deposit polycrystalline SiC, subsequently heating the SiC laminate further to 1,414° C. or above and carrying out SiC deposition while melting part or all of the support substrate made of silicon, which has a thermal expansion coefficient that differs from that of the polycrystalline SiC substrate, and then cooling, the appearance of stresses originating in the polycrystalline SiC substrate (thermal stress and internal stress) can be suppressed. As a result, the simple and convenient production of high-quality SiC composite substrate having little warpage is achieved.

An embodiment of the inventive method for producing SiC composite substrates is described below while referring to FIGS. 1A through 1I.

(Step 1)

First, a monocrystalline SiC substrate 12s which is to be bonded to the support substrate 21 is provided. The monocrystalline SiC substrate 12s is preferably selected from among ones having a crystal structure that is 4H—SiC, 6H—SiC or 3C—SiC. The size of the monocrystalline SiC substrate 12s and the subsequently described support substrate 21 is set according to such factors as the size required for semiconductor element fabrication or gallium nitride, diamond and nanocarbon film growth, and the cost. Also, a monocrystalline SiC substrate 12s having a thickness in the vicinity of the substrate thickness specified in the SEMI standards or the JEIDA standards is preferable in terms of handleability. The monocrystalline SiC substrate 12s used here may be a commercially available product, such as a monocrystalline SiC wafer that is sold commercially for use in power devices. The use of one whose surface has been finish polished by chemical mechanical polishing (or planarization) and has a flat and smooth surface is preferred.

It is preferable to form a specific thin film 12a on at least the front side of the monocrystalline SiC substrate 12s that is to be bonded to the support substrate 21 (FIG. 1A). The thin film 12a should be a dielectric film, such as a silicon oxide film, silicon nitride film or silicon oxynitride film, having a thickness of from about 50 nm to about 600 nm. Not only does this thin film 12a facilitate bonding with the support substrate 21, it also has the effect of suppressing the channeling of implanted ions in the ion implantation treatment that is carried out thereafter. The thin film 12a may be provided following the subsequently described ion implantation treatment.

Any method may be used to form the thin film 12a, provided it is a film-forming method capable of forming the thin film 12a so that it adheres well to the monocrystalline SiC substrate 12s. For example, a silicon oxide film may be formed by PECVD or thermal oxidation; a silicon nitride film or a silicon oxynitride film may be formed by sputtering.

(Step 2)

Next, a support substrate 21 made of silicon is provided. Use should be made of, for example, a polycrystalline Si wafer or a monocrystalline Si wafer.

Also, it is preferable to form a thin film 21a similar to that in Step 1 on at least the front side of the support substrate 21 that is to be bonded to the monocrystalline SiC substrate 12s, and more preferable to form a thin film 21a made of the same material as the thin film 12a formed in Step 1 (FIG. 1B). FIGS. 1A through 1I show an example in which a thin film 21a has been provided over all sides (front and back sides) of the support substrate 21.

(Step 3)

Next, an ion implant region 12i is formed by implanting hydrogen ions or the like into the thin film 12a-forming side of the monocrystalline SiC substrate 12s (FIG. 1C).

Here, during ion implantation into the monocrystalline SiC substrate 12s, a predetermined dose of at least hydrogen ions ($H^+$) or molecular hydrogen ions ($H_2^+$) is introduced at an implantation energy that enables the formation of an ion implant region 12i to the desired depth from the surface thereof. With regard to the conditions at this time, the ion implantation energy should be set so as to obtain a thin film of the desired thickness. Helium ions, boron ions and the like may be implanted at the same time; any ions that can obtain the same effect may be used.

The dose of hydrogen ions ($H^+$) implanted to the monocrystalline SiC substrate 12s is preferably from $1.0 \times 10^{16}$ atoms/cm$^2$ to $9.0 \times 10^{17}$ atoms/cm$^2$. At less than $1.0 \times 10^{16}$ atoms/cm$^2$, embrittlement of the interface may not occur. On the other hand, at more than $9.0 \times 10^{17}$ atoms/cm$^2$, bubbles sometimes form during heat treatment after bonding, resulting in transfer defects.

When molecular hydrogen ions ($H_2^+$) are used as the implanted ions, the dose thereof is preferably from $5.0 \times 10^{15}$ atoms/cm$^2$ to $4.5 \times 10^{17}$ atoms/cm$^2$. At less than $5.0 \times 10^{15}$ atoms/cm$^2$, embrittlement of the interface may not occur, whereas at more than $4.5 \times 10^{17}$ atoms/cm$^2$, bubbles sometimes form during heat treatment after bonding, resulting in transfer defects.

The depth to the ion implant region 12i from the ion-implanted substrate surface (i.e., the ion implantation depth) corresponds to the desired thickness of the monocrystalline SiC thin film to be provided on the support substrate 21. This is generally from 100 to 2,000 nm, preferably from 300 to 500 nm, and more preferably about 400 nm. It is desirable for the ion implant region 12i (i.e., the ion distribution thickness) to have a thickness which readily enables exfoliation by means of mechanical impact or the like; the thickness is preferably from 200 to 400 nm, and more preferably about 300 nm.

(Step 4)

Next, the side of the monocrystalline SiC substrate 12s on which the thin film 12a has been formed and the side of the support substrate 21 on which the silicon oxide film 21a has been formed are bonded together by mutually surface activation-treating the surfaces. Plasma activation treatment, vacuum ion beam treatment or immersion treatment in ozone water may be carried out as the surface activation treatment.

Of these, when plasma activation treatment is carried out, the monocrystalline SiC substrate 12s and/or support substrate 21 on which treatment up to Step 3 above has been completed are loaded into a vacuum chamber and a plasma-generating gas is introduced into the chamber at reduced pressure, following which the substrates are exposed for about 5 to 10 seconds to high-frequency plasma at about 100 W, thereby plasma-activating the surface. Oxygen gas, hydrogen gas, nitrogen gas, argon gas, a mixed gas thereof or a mixed gas of hydrogen gas and helium gas may be used as the plasma-generating gas.

In the case of vacuum ion-beam treatment, activation treatment is carried out by loading the monocrystalline SiC substrate 12s and/or the support substrate 21 into a high-vacuum chamber, and directing an ion beam of argon or the like at the surfaces to be bonded.

In the case of immersion treatment in ozone water, the monocrystalline SiC substrate 12s and/or the support substrate 21 are immersed in ozone water (water in which ozone gas has been dissolved), thereby activating the surfaces.

These surface activation treatments may be carried out only on the monocrystalline SiC substrate 12s or only on the support substrate 21, although such treatment is preferably carried out on both the monocrystalline SiC substrate 12s and the support substrate 21.

Surface activation treatment may be carried out by any one of the above methods or by a combination thereof. The sides of the monocrystalline SiC substrate 12s and the support substrate 21 where surface activation treatment is carried out are those sides on the respective substrates where bonding is to be carried out, i.e., the thin film 12a surface and the thin film 21a surface.

These surfaces of the monocrystalline SiC substrate 12s and the support substrate 21 that have been surface activation treated (i.e., the surfaces of the thin films 12a and 21a) are then bonded together as the bonding surfaces.

After bonding together the monocrystalline SiC substrate 12s and the support substrate 21, heat treatment may be carried out at preferably between 150 and 350° C., and more preferably between 150 and 250° C., so as to increase the bond strength at the bonding interface between the thin films 12a and 21a. Because substrate warpage arises at this time due to the difference between the thermal expansion coefficients for the monocrystalline SiC substrate 12s and the support substrate 21, it is desirable to minimize warpage by using a temperature suitable to the respective materials thereof. Although the heat treatment time depends to some degree on the temperature as well, a period of from 2 to 24 hours is preferred.

In this way, the thin film 12a and the thin film 21a mutually adhere and function as an intermediate layer (intervening layer) 13. The monocrystalline SiC substrate 12s and the support substrate 21 strongly adhere to one another through this intermediate layer, forming a bonded substrate 13 (Step 1D).

(Step 5)

With regard to the bonded substrate 13, a monocrystalline SiC thin film that has exfoliated from the monocrystalline SiC substrate 12s at the ion implant region 12i with the application of thermal energy or mechanical energy to the ion-implanted portion is transferred onto the support substrate 21.

At this time, because the thin film 12a and the thin film 21a firmly adhere to one another, and moreover because the thin film 12a and the thin film 21a firmly adhere to, respectively, the monocrystalline SiC substrate 12s and the support substrate 21, exfoliation does not arise in places other than the area of exfoliation at the ion implant region 12i.

The exfoliation method used may be, for example, a thermal exfoliation process that involves heating the bonded substrate 13 to an elevated temperature, which heat generates tiny bubbles of the ion-implanted constituent within the ion implant region 12i, causing exfoliation to arise and thereby separating off a monocrystalline SiC substrate 12s. Alternatively, use may be made of a mechanical exfoliation process in which, while carrying out low-temperature heat treatment of a degree that does not induce thermal exfoliation (e.g., between 500 and 900° C., and preferably between 500 and 700° C.), a physical impact is applied to one end of the ion implant region 12i, inducing mechanical exfoliation and thereby separating off a monocrystalline SiC substrate 12s. Mechanical exfoliation is more preferable because the transfer surface following monocrystalline SiC thin film transfer has a relatively low roughness compared with the surface obtained by thermal exfoliation.

Following exfoliation treatment, heat treatment to improve adhesion between the monocrystalline SiC thin film and the support substrate 21 may be carried out by heating the monocrystalline SiC thin film carrier at a temperature between 700 and 1,000° C. that is higher than the temperature during exfoliation treatment, for a heating time of from 1 to 24 hours.

The monocrystalline SiC thin film surface on the support substrate 21 is mirror finished to give monocrystalline SiC layer 12, thereby obtaining a monocrystalline SiC layer carrier 14 (FIG. 1E). Specifically, the monocrystalline SiC thin film is subjected to chemical mechanical polishing (CMP), thereby removing the damage layer owing to ion implantation and also mirror-polishing the surface. This may be carried out by a known CMP polishing process used for planarizing silicon wafers.

The monocrystalline SiC layer 12 is a thin film made of monocrystalline SiC having a thickness of not more than 5 μm, preferably not more than 2 μm, more preferably at least 100 nm and not more than 1 μm, even more preferably at least 200 nm and not more than 800 nm, and most preferably at least 300 nm and not more than 500 nm. At a monocrystalline SiC layer thickness of 5 μm or less, even factoring in the cost of rendering this into a composite substrate, this is economically more advantageous than using a pure monocrystalline SiC substrate.

The monocrystalline SiC substrate 12s following exfoliation, by again subjecting the surface to polishing, cleaning and the like, can be re-used as a substrate for bonding in the same method for producing a monocrystalline SiC layer carrier 14.

[Step 6]

The resulting monocrystalline SiC layer carrier 14 is heated to below 1,414° C. and polycrystalline SiC is deposited on the monocrystalline SiC layer 12 by chemical vapor deposition to form a polycrystalline SiC thin film 11a that becomes part of the polycrystalline SiC substrate 11, thereby giving a SiC laminate 15a (FIG. 1F). Treatment in this step is called first-stage (low-temperature) chemical vapor deposition. The SiC laminate 15a here is constructed of a thin film 22a, a thin film 12a, a monocrystalline SiC layer 12 and a polycrystalline SiC thin film 11a stacked in this order on a support substrate 21.

Thermal CVD is preferably used here as the chemical vapor deposition process. The thermal CVD conditions may be conditions commonly used in film formation by the deposition of polycrystalline SiC.

In the stage one (low-temperature) chemical vapor deposition of this step, it is preferable to heat the monocrystalline SiC layer carrier 14 to at least 1,100° C. and not more than 1,300° C.

The thickness t1 of the polycrystalline SiC thin film 11a is preferably at least 30 μm. This makes it possible for the SiC laminate 15a to maintain its shape (planar state) even when part or all of the support substrate 21 is removed in the next step. In addition, letting t be the thickness of the polycrystalline SiC substrate 11 ultimately formed, the thickness t1 of the polycrystalline SiC thin film 11a is preferably set to at least 0.075 t and not more than 0.5 t, and more preferably set to at least 0.187 t and not more than 0.5 t.

(Step 7)

Next, the resulting SiC laminate 15a is heated to at least 1,414° C. and at least part of the support substrate 21 is melted, along with which polycrystalline SiC is additionally deposited on the polycrystalline SiC thin film 11a by chemical vapor deposition, thereby forming a polycrystalline SiC thin film 11b and obtaining a SiC laminate 15 having a polycrystalline SiC substrate 11 consisting of polycrystalline SiC thin films 11a and 11b (FIG. 1G). Treatment in this step is called stage two (high-temperature) chemical vapor deposition. At this time, part or all of the support substrate 21 melts; the melted portion of the support substrate 21 may be removed or retained as is and cooled following film formation. Accordingly, the SiC laminate 15 here is either constructed of the thin film 21a', the thin film 12a, the monocrystalline SiC layer 12 and polycrystalline SiC thin films 11a and 11b stacked in this order, or is constructed of the thin film 21a', the thin film 12a, the monocrystalline SiC layer 12 and the polycrystalline SiC substrate 11 stacked in this order, on the support substrate 21'.

In the stage two (high-temperature) chemical vapor deposition of this step, the temperature is raised to preferably at least 1,414° C. and not more than 1,800° C., and more preferably at least 1,414° C. and not more than 1,600° C., without lowering the temperature of the SiC laminate 15a from the preceding step (Step 6). By heating to at least 1,414° C., the support substrate 21 is melted and can be set in a liquefied state; by heating to not more than 1,800° C., SiC can be formed without inducing a phase transition.

The heating means may be a heater belonging to the CVD system. The SiC laminate 15a may be loaded into this CVD system and there heated.

By thus carrying out SiC deposition while heating the SiC laminate 15a to at least 1,414° C., the support substrate 21 made of silicon melts and enters into a liquefied state, enabling stress to be alleviated. As a result, the temperature and the amount of SiC deposited can be adjusted in such a way that the amount of bow in the SiC composite substrate 10 ultimately obtained becomes preferably between −50 μm and +75 μm, more preferably between −50μ and +50 μm, even more preferably between −30μ and +50 μm, and most preferably between 0 μm and +30 μm.

Thermal CVD is preferably used here as the chemical vapor deposition process. The thermal CVD conditions, aside from the heating temperature, may be the same as in stage one (low-temperature) vapor deposition in the preceding step (Step 6).

Letting t be the thickness of the polycrystalline SiC substrate 11 ultimately formed, the thickness t2 of the polycrystalline SiC thin film 11b formed in this step is preferably set to at least 0.5 t and not more than 0.925 t, and more preferably set to at least 0.5 t and not more than 0.813 t.

The thickness t of the polycrystalline SiC substrate 11 is preferably from 100 to 650 μm, more preferably from 200 to 600 μm, and even more preferably from 300 to 500 μm. By setting the thickness to at least 100 μm, the function as a handle substrate is easily achieved; by setting the thickness to not more than 650 μm, the cost can be held in check.

The polycrystalline SiC of the polycrystalline SiC substrate 11 is preferably cubic (3C—SiC). The resistivity may be adjusted by introducing impurities into the polycrystalline SiC substrate 11. In this way, suitable use as a substrate for a vertical power semiconductor device is possible.

Following formation of the polycrystalline SiC substrate 11, the SiC laminate 15 is cooled to room temperature. At this time, in cases where the support substrate 21 remains in the original form, because there is a difference between the coefficients of thermal expansion for the polycrystalline SiC substrate 11 (SiC) and the support substrate 21 (Si) (the thermal expansion coefficient for SiC being larger than that for silicon), thermal stress arises between the polycrystalline SiC substrate 11 and the support substrate 21, as a result of which the SiC laminate 15 tries to assume a shape that is downwardly convex at the center portion of the substrate (convex toward the back face of the support substrate 21 in the diagram). In this invention, as described above, because some or all of the support substrate 21 is melted (becoming support substrate 21'), thermal stress between the polycrystalline SiC substrate 11 and the support substrate 21' and internal stress in the polycrystalline SiC substrate 11 are suppressed, enabling the SiC laminate 15 overall to maintain a planar state.

(Step 8)

Next, the remaining support substrate 21' in the SiC laminate 15 obtained in Step 7 is physically and/or chemically removed to obtain a SiC composite substrate 10 (FIG. 1H). At this time, because the support substrate 21' is made of silicon, it is preferable, for example, to remove most of the support substrate 21' by machining and then selectively remove the remaining support substrate 21', thin film 21a' and thin film 12a by etching with fluoronitric acid.

Even when all of the support substrate 21 has been removed in the preceding step, because the thin film 21a' in the region in contact with the thin film 12a remains, removal by chemical etching is required.

A SiC composite substrate 10 that is substantially free of warpage can thus be obtained. The polycrystalline SiC substrate 11 at this time is made of the same SiC as the overlying monocrystalline SiC layer 12. Given that the monocrystalline SiC layer 12 and the polycrystalline SiC substrate 11 have substantially the same thermal expansion coefficient, warping of the SiC composite substrate 10 is suppressed at any temperature.

(Step 9)

Where necessary, a SiC epitaxial layer 12' may be formed on the monocrystalline SiC layer 12 of the SiC composite substrate 10 (FIG. 1I). Hence, even when the monocrystalline SiC layer 12 is too thin for use as the active layer of a power semiconductor device, by forming a SiC epitaxial layer 12' of a given thickness, it is possible to obtain a SiC composite substrate adapted for power semiconductor fabrication.

EXAMPLES

Figure 2B:
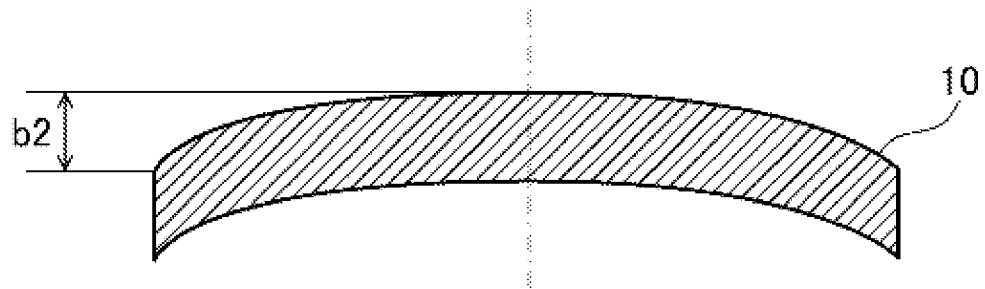

The invention is illustrated more fully below by way of a Test Example, although the invention is not limited by the Test Example. Warping of the substrate was measured as the amount of bow using a normal incidence Fizeau interferometer (Flat Master, from Corning Tropel Corporation). As shown in FIGS. 2A and 2B, the amounts of bow b1 and b2 were measured as the vertical difference between the center and edge portions of the SiC composite substrate 10. When the center of the substrate was downwardly convex as shown in FIG. 2A, the vertical difference was treated as a negative value; when upwardly convex as shown in FIG. 2B, the vertical difference was treated as a positive value. The SiC composite substrate 10 was oriented with the monocrystalline SiC layer 12 on the top side (front side) when measuring the warpage.

Test Example 1

In this Test Example, an SiC composite substrate was produced as follows, according to the procedure of the above-described embodiment of the invention.

First, a 3-inch diameter 4H—SiC monocrystalline wafer was provided as the monocrystalline SiC substrate 12s. A silicon oxide film ($SiO_2$ film) having a thickness of 200 nm was formed on one side thereof as the thin film 12a by chemical vapor deposition and polished (FIG. 1A). The side of the wafer having the thin film 12a formed thereon was implanted with $H^+$ ions at an energy of 160 keV and a dose of $8.8 \times 10^{16}$ atoms/$cm^2$ (FIG. 1C). Separately, a 3-inch diameter monocrystalline Si wafer having a thickness of 400 μm was provided as the support substrate 21, and a thin film 21a having a thickness of 1 μm and made of $SiO_2$ was formed on the front side thereof by chemical vapor deposition (FIG. 1B). The thin film 21a was polished at this time, thereby planarizing the surface.

Next, the side of the monocrystalline SiC substrate 12s having the thin film 12a formed thereon and the front side of the support substrate 21 having the thin film 21a formed thereon were each subjected to plasma activation treatment, after which the sides on both substrates having a silicon oxide film formed thereon were bonded together surface-to-surface, thereby forming a bonded substrate 13 (FIG. 1D).

The bonded substrate 13 was then heat-treated at 750° C. for 12 hours, following which it was returned to room temperature. Making use of the mechanical exfoliation process, a mechanical impact was applied to the ion implant region 12i of the monocrystalline SiC substrate 12s so as to induce exfoliation of a monocrystalline SiC thin film from the monocrystalline SiC substrate 12s, and the thin film was transferred to the support substrate 21, thereby giving a monocrystalline SiC layer carrier 14 in which a 4H—SiC monocrystalline SiC layer 12 having a thickness of 800 nm is supported on the support substrate 21 over an intervening silicon oxide film (FIG. 1E). A plurality of such monocrystalline SiC layer carriers 14 were produced under the same conditions.

Next, the surface layer of the monocrystalline SiC layer 12 in the monocrystalline SiC layer carrier 14 was removed by dry etching using $CF_4$ and $O_2$ as the ambient gases, following which thermal CVD treatment was carried out as the stage one (low-temperature) vapor deposition under the conditions shown below so as to form, to varying film thicknesses, a 3C—SiC polycrystalline SiC thin film 11a on the monocrystalline SiC layer 12, thereby producing a SiC laminate 15a (FIG. 1F).

Source gases: Silicon tetrachloride and propane
Pressure: 17 Pa
Heating temperature of monocrystalline SiC layer carrier 14: 1,200° C.
Thicknesses t1 of polycrystalline SiC thin film 11a: 400, 300, 250, 200, 150, 100, 75, 50, 30, 25 μm Next, the SiC laminate 15a was further heated without cooling and thermal CVD treatment was carried out under the conditions shown below as the stage two (high-temperature) vapor deposition so as to form on the polycrystalline SiC thin film 11a, to varying film thicknesses, a 3C—SiC polycrystalline SiC thin film 11b that results in a combined film thickness with the polycrystalline SiC thin film 11a of 400 μm, thereby producing a SiC laminate 15 (FIG. 1G). In the case where the polycrystalline SiC thin film 11a had a thickness of 400 μm, the SiC laminate was cooled as is, without carrying out this treatment.

Source gases: Silicon tetrachloride and propane
Pressure: 17 Pa
Heating temperature of SiC laminate 15a: 1,490° C.
Thicknesses t2 of polycrystalline SiC thin film 11b: 100, 150, 200, 250, 300, 325, 350, 370, 375 μm After formation of the polycrystalline SiC thin film 11b, the SiC laminate 15 was cooled to room temperature, whereupon the specimen having a polycrystalline SiC thin film 11a with a film thickness t1=25 μm and a polycrystalline SiC thin film 11b with a film thickness t2=375 μm cracked and failed. Cracking did not arise in the other specimens.

The support substrate 21' of this SiC laminate 15 was then ground away with a fixed whetstone. Specifically, the grit of the whetstone was successively changed in the following order: #1000, #2500, #4000, and grinding was carried out until substantially none of the support substrate 21' remained. Next, the silicon oxide films 21a' and 12a were removed by etching with an aqueous HF solution, thereby giving a SiC composite substrate 10 having, on a polycrystalline SiC substrate 11, a monocrystalline SiC layer 12 with an ultraclean surface (FIG. 1H).

Table 1 shows the relationship between the film thicknesses t1 and t2 of the polycrystalline SiC thin films 11a and 11b and the warpage (amount of bow) in the SiC composite substrate 10.

As shown in Table 1, when the film thickness t1 of the polycrystalline SiC thin film 11a was 400 μm (the film thickness t2 of the polycrystalline SiC thin film 11b=0 μm), the warpage (amount of bow) of the SiC composite substrate 10 became 750 μm, which was an amount of deformation that makes subsequent wafer processes difficult. By including a stage two (high-temperature) vapor deposition step, warpage of the SiC composite substrate 10 was ameliorated. Here, as the film thickness t2 of the polycrystalline SiC thin film 11b increases, warpage of the SiC composite substrate 10 decreases, with the amount of bow becoming 100 μm or less at a film thickness t2 in the range of 200 to 370 μm, and the amount of bow becoming smallest (37 μm) at a film thickness t2 of 325 μm.

TABLE 1

| SiC laminate | Polycrystalline SiC thin-film thickness (μm) | Stage one (low-temperature) vapor deposition t1 | 400 | 300 | 250 | 200 | 150 | 100 | 75 | 50 | 30 | 25 |
|---|---|---|---|---|---|---|---|---|---|---|---|---|
| | | Stage two (high-temperature) vapor deposition t2 | 0 | 100 | 150 | 200 | 250 | 300 | 325 | 350 | 370 | 375 |
| | Thin-film thickness ratio | Total (t1 + t2) | 400 | 400 | 400 | 400 | 400 | 400 | 400 | 400 | 400 | 400 |
| | | t1/(t1 + t2) | 1.000 | 0.750 | 0.625 | 0.500 | 0.375 | 0.250 | 0.187 | 0.125 | 0.075 | 0.062 |
| | | t2/(t1 + t2) | 0.000 | 0.250 | 0.375 | 0.500 | 0.625 | 0.750 | 0.813 | 0.875 | 0.925 | 0.938 |
| SiC composite substrate | Amount of bow (μm) | | 750 | 430 | 158 | 52 | 43 | 48 | 37 | 66 | 72 | failed after cooling |

The invention has been described above by way of the embodiment shown in the diagrams. However, the invention is not limited to the embodiment shown in the diagrams, various modifications such as other embodiments, additions, deletions and substitutions being possible within a range conceivable by those skilled in the art, insofar as all such variations exhibit the operation and advantageous effects of the invention and are encompassed within the scope of the invention.

REFERENCE SIGNS LIST

10 SiC composite substrate
11 Polycrystalline SiC substrate
11a, 11b Polycrystalline SiC thin films
12 Monocrystalline SiC layer
12a, 21a, 21a' Thin films
12i Ion implant region 12s Monocrystalline SiC substrate
12' SiC epitaxial layer
13 Bonded substrate
14 Monocrystalline SiC layer carrier
15a, 15 SiC laminates
21, 21' Support substrates

The invention claimed is:

1. A method for producing a SiC composite substrate comprising a monocrystalline SiC layer on a polycrystalline SiC substrate, the method comprising, in order, the steps of:
   providing a monocrystalline SiC layer on one side of a support substrate made of silicon so as to produce a monocrystalline SiC layer carrier;
   producing a SiC laminate comprising the monocrystalline SiC layer and a polycrystalline SiC substrate of thickness t stacked on the support substrate, by using a chemical vapor deposition process to deposit polycrystalline SiC on the monocrystalline SiC layer and then cooling, said deposition of the polycrystalline SiC comprising
   (i) heating the monocrystalline SiC layer carrier to below 1,414° C. and depositing thereon only part of the polycrystalline SiC substrate, which is a thickness t1 of at least 30 μm, and
   (ii) subsequently raising the temperature to 1,414° C. or above and additionally depositing polycrystalline SiC up to the thickness t, which is at least 100 μm and not more than 650 μm, while melting at least part of the support substrate; and
   physically and/or chemically removing the support substrate.

2. The SiC composite substrate production method of claim 1, wherein the chemical vapor deposition process is thermal chemical vapor deposition.

3. The SiC composite substrate production method of claim 1, wherein an intermediate layer made of silicon oxide, silicon nitride or silicon oxynitride is provided between the support substrate and the monocrystalline SiC layer.

4. The SiC composite substrate production method of claim 1, wherein the monocrystalline SiC layer is provided by transferring onto the support substrate a monocrystalline SiC thin film exfoliated from a monocrystalline SiC substrate by ion-implantation exfoliation.

5. The SiC composite substrate production method claim 1, wherein the monocrystalline SiC layer is provided by heteroepitaxial growth of SiC on the support substrate.

6. The SiC composite substrate production method of claim 1, wherein the thickness $t_1$ of the polycrystalline SiC deposited when the monocrystalline SiC carrier is heated to below 1,414° C. is at least 0.075t and not more than 0.5t, and a thickness t2 of the polycrystalline SiC deposited when the monocrystalline SiC carrier is heated to 1,414° C. or more is at least 0.5t and not more than 0.925t.

7. The SiC composite substrate production method of claim 1, wherein the amount of bow in the SiC composite is 100 μm or less.

8. The SiC composite substrate production method of claim 1 wherein the amount of bow in the SiC composite is between −50 μm and +75 μm.

* * * * *